US011108368B2

(12) United States Patent
Marek et al.

(10) Patent No.: US 11,108,368 B2
(45) Date of Patent: Aug. 31, 2021

(54) HIGH POWER, DOUBLE-SIDED THIN FILM FILTER

(71) Applicant: AVX Corporation, Fountain Inn, SC (US)

(72) Inventors: Michael Marek, Jerusalem (IL); Elinor O'Neill, Jerusalem (IL); Ronit Nissim, Jerusalem (IL)

(73) Assignee: AVX Corporation, Fountain Inn, SC (US)

( * ) Notice: Subject to any disclaimer, the term of this patent is extended or adjusted under 35 U.S.C. 154(b) by 10 days.

(21) Appl. No.: 16/808,925

(22) Filed: Mar. 4, 2020

(65) Prior Publication Data

US 2020/0295727 A1    Sep. 17, 2020

Related U.S. Application Data

(60) Provisional application No. 62/819,821, filed on Mar. 18, 2019, provisional application No. 62/817,140, filed on Mar. 12, 2019.

(51) Int. Cl.
*H03H 7/01* (2006.01)
*H01L 27/01* (2006.01)
*H03H 5/02* (2006.01)

(52) U.S. Cl.
CPC ............. *H03H 5/02* (2013.01); *H01L 27/016* (2013.01)

(58) Field of Classification Search
CPC ................................ H03H 7/01; H01L 27/01
USPC .................................................. 333/185, 172
See application file for complete search history.

(56) References Cited

U.S. PATENT DOCUMENTS

| 9,871,004 B2 | 1/2018 | Zhai |
| 10,158,338 B2 | 12/2018 | Tseng |
| 10,277,190 B2 | 4/2019 | Masuda et al. |
| 10,432,152 B2 | 10/2019 | Watts et al. |
| 2020/0082982 A1 | 3/2020 | Yazaki |

OTHER PUBLICATIONS

Al-Fadhli et al, "The Effect of Adding Alumina and Graphite Particles to Improve the Mechanical Properties of Composites", 2009, 10 pages.
AT Ceramics, "ATC 2816 High Performance Low Pass Filter", Mar. 2017, 8 pages.
AVX RF, "512MHz 15W High Performance Low Pass Filter", Jan. 2, 2017. 17 pages.
AVX RF, "High Performance Harmonic Low Pass Filter", Oct. 15, 2015, 54 pages.
D.D.L. Chung, "Polymer-Matrix Composites for Microelectronics", Composite Materials Research Laboratory, Buffalo, New York, Jan. 25, 2000, 11 pages.
He et al., "Thermal conductivity of ceramic particle filled polymer composites and theoretical predications", Journal of Materials Science, Jan. 2007, 7 pages.

(Continued)

*Primary Examiner* — Dean O Takaoka
(74) *Attorney, Agent, or Firm* — Dority & Manning, P.A.

(57) ABSTRACT

A high power thin film filter is disclosed includes a substrate having a substrate thickness in a Z-direction between a first surface and a second surface. A thin film capacitor may be formed over the first surface. A thin film inductor may be spaced apart from the thin film capacitor by at least the thickness of the substrate. A via may be formed in the substrate that electrically connects the thin film capacitor and the thin film inductor. The via may include a polymeric composition.

23 Claims, 13 Drawing Sheets

(56) References Cited

OTHER PUBLICATIONS

Johanson Technology, "High Frequency Ceramic Solutions, 500 MHz Low Pass Filter", Camarillo, California, 2012, 3 pages.
Electronically Conductive Adhesives by Gomatam, date unknown, 2 pages.
International Search Report and Written Opinion for PCT/US2020/020968, dated Jun. 24, 2020, 9 pages.

HIGH POWER, DOUBLE-SIDED THIN FILM FILTER

CROSS REFERENCE TO RELATED APPLICATIONS

The present application claims filing benefit of U.S. Provisional Patent Application Ser. No. 62/817,140 having a filing date of Mar. 12, 2019 and U.S. Provisional Patent Application Ser. No. 62/819,821 having a filing date of Mar. 18, 2019, which are incorporated herein by reference in their entirety.

FIELD OF THE INVENTION

The present subject matter generally concerns thin film filters. More particularly, the present subject matter relates to a high power, double-sided thin film filter.

BACKGROUND OF THE INVENTION

High frequency radio signal communication has increased in popularity. A trend towards miniaturization has also increased the desirability of small, passive components and generally decreased the power handling capacity of such components. Miniaturization has also increased the difficulty of surface mounting small, passive components. Thus, a small, surface mountable filter having high power handling capacity would be welcomed in the art.

SUMMARY

In accordance with one embodiment of the present invention, a high power thin film filter may include a substrate having a first surface and a second surface opposite the first surface in a Z-direction. A thin film capacitor may be formed over the bottom surface. A thin film inductor may be spaced apart from the thin film capacitor by at least the substrate in the Z-direction. A via may be formed in the substrate and electrically connecting the thin film capacitor and the thin film inductor. The via may include a polymeric composition.

In accordance with another embodiment of the present invention, a high power thin film filter may include a substrate having a first surface and a second surface opposite the first surface in a Z-direction. The filter may include a thin film capacitor formed over the bottom surface. The filter may include a thin film inductor that is spaced apart from the thin film capacitor by at least the substrate in the Z-direction. The high power thin film filter may have an area power capacity that is greater than about 0.5 W/mm$^2$.

In accordance with another embodiment of the present invention, a method for forming a high power thin film filter may include providing a substrate having a first surface and a second surface opposite the first surface in a Z-direction. The method may include depositing a thin film capacitor over the bottom surface; depositing a thin film inductor that is spaced apart from the thin film capacitor by at least the substrate in the Z-direction; and forming a via in the substrate and electrically connecting the thin film capacitor and the thin film inductor. The via may include a polymeric composition.

BRIEF DESCRIPTION OF THE DRAWINGS

A full and enabling disclosure of the present invention, including the best mode thereof, directed to one of ordinary skill in the art, is set forth in the specification, which makes reference to the appended Figures, in which.

Figure 1A:
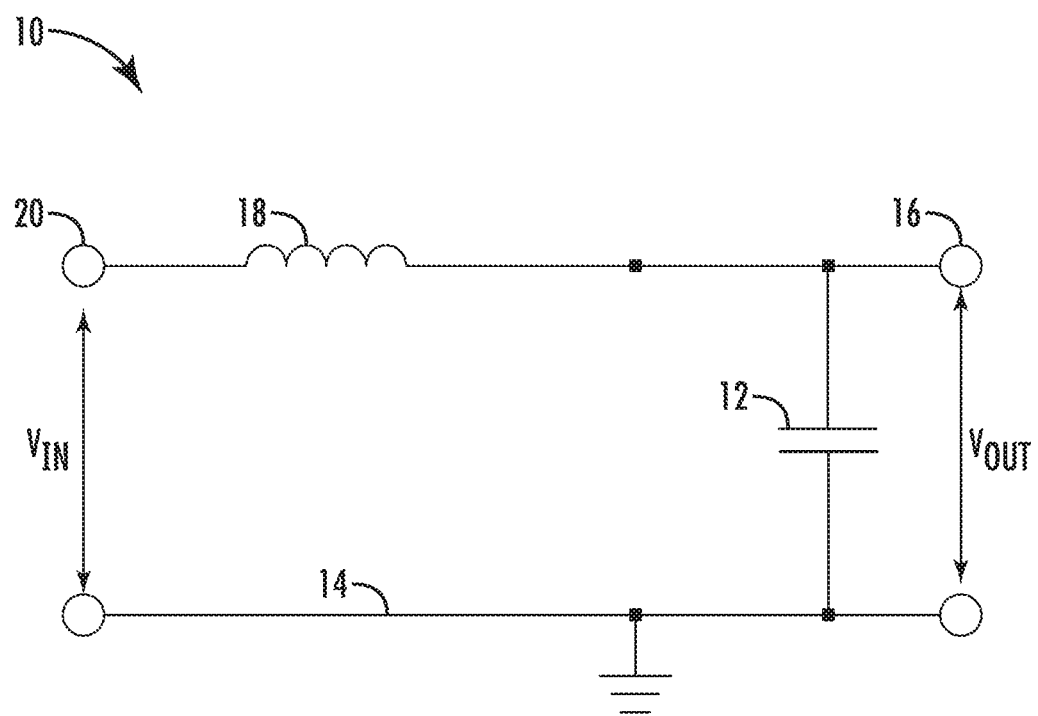
FIG. 1A illustrates a schematic of a filter according to aspects of the present disclosure.

Repeat use of reference characters throughout the present specification and appended drawings is intended to represent same or analogous features or elements of the invention.

DETAILED DESCRIPTION OF REPRESENTATIVE EMBODIMENTS

A high power thin film filter is disclosed that has excellent power handling capabilities. The thin film filter may be configured as a compact, surface-mountable device, for example using grid array-type mounting (e.g., land grid array (LGA) type mounting, ball grid array (BGA) type, etc.). This combination may be desirable for ease of mounting and/or for applications in which available mounting space on a printed circuit board is limited.

The filter may have a variety of features that improve the power handling capabilities of the filter. For example, the filter may include a substrate having a substrate thickness in a Z-direction between a top surface and a bottom surface. The filter may include a thin film capacitor and a thin film inductor. The thin film inductor may be spaced apart from the thin film capacitor by at least the thickness of the substrate. Spacing apart the thin film capacitor and inductor by at least the thickness of the substrate may improve the power handling capability of the filter by improving heat dissipation. Thus, the double-sided design of the filter may improve the power capacity of the filter.

In some embodiments, the power capacity of the filter may be greater than about 10 W, in some embodiments greater than about 12 W, in some embodiments greater than about 13 W, in some embodiments greater than about 15 W, in some embodiments greater than about 20 W, and in some embodiments about 25 W or greater.

The filter may have a high power capacity relative to an area or footprint of the filter in an X-Y plane. For example, the filter may have an area power capacity that is greater than about 0.3 W/mm$^2$, in some embodiments greater than about 0.4 W/mm$^2$, in some embodiments greater than about 0.5 W/mm$^2$, in some embodiments greater than about 0.8 W/mm$^2$, in some embodiments greater than about 1.0 W/mm$^2$, in some embodiments greater than about 1.2 W/mm$^2$, in some embodiments greater than about 1.4 W/mm$^2$, in some embodiments greater than about 1.7 W/mm$^2$.

The filter may have a high power capacity relative to a volume of the filter. For example, the filter may have a volume power capacity that is greater than about 0.3 W/mm$^3$, in some embodiments greater than about 0.4 W/mm$^3$, in some embodiments greater than about 0.5 W/mm$^3$, in some embodiments greater than about 0.8 W/mm$^3$, in some embodiments greater than about 1.0 W/mm$^3$, in some embodiments greater than about 1.2 W/mm$^3$, in some embodiments greater than about 1.4 W/mm$^3$, in some embodiments greater than about 1.7 W/mm$^3$.

The thickness of the substrate may be greater than about 100 microns, in some embodiments greater than about 200 microns, in some embodiments greater than about 400 microns, in some embodiments greater than about 600 microns, in some embodiments greater than about 800 microns, in some embodiments greater than about 1 mm, in some embodiments greater than about 2 mm, and in some embodiments greater than about 3 mm.

The filter may include additional features facilitating higher power handling capabilities. For example, the filter may include vias that are wide relative to their lengths. The via(s) may have respective via width in the X-Y plane. A ratio of the substrate thickness to the via width(s) may be less than about 7, in some embodiments less than about 6, in some embodiments less than about 5, in some embodiments less than about 4, in some embodiments less than about 3. For instance, the via width(s) may be greater than about 100 microns, in some embodiments greater than about 200 microns, in some embodiments greater than about 300 microns, and in some embodiments greater than about 350 microns.

The vias may include a conductive layer adjacent an inner surface of the substrate. The conductive layer can extend through the substrate from the first surface to the second surface of the substrate to provide electrical connection therebetween. The via may be filled with a suitable polymeric material, for example to improve heat dissipation and facilitate high power capacity. For example, the via may be formed by drilling (e.g., mechanical drilling, laser drilling etc.) a through hole in the substrate. The conductive layer may be formed over (e.g., directly on or with one more intermediate layers therebetween) the inner surface of the substrate using sputtering, electroless plating, electroplating, a combination thereof, or any other suitable technique. The conductive layer may include a variety of suitable conductive materials, such as copper, silver, aluminum, or any other suitable conductive metal or non-metallic material. The hole may then be filled with a polymeric composition.

For example, the polymeric composition may include an epoxy and/or resin. Examples include, for instance, epoxy resins, polyimide resins, melamine resins, urea-formaldehyde resins, polyurethane resins, phenolic resins, polyester resins, etc. Epoxy resins are particularly suitable. Examples of suitable epoxy resins include, for instance, bisphenol A type epoxy resins, bisphenol F type epoxy resins, phenol novolac type epoxy resins, orthocresol novolac type epoxy resins, brominated epoxy resins and biphenyl type epoxy resins, cyclic aliphatic epoxy resins, glycidyl ester type epoxy resins, glycidylamine type epoxy resins, cresol novolac type epoxy resins, naphthalene type epoxy resins, phenol aralkyl type epoxy resins, cyclopentadiene type epoxy resins, heterocyclic epoxy resins, etc. The polymer may include a thermoset resin, thermoplastic resin, or any other suitable resin.

The polymeric composition may include dispersed particles (e.g., as a polymer matrix). In some embodiments, the particles may have a relatively high thermal conductivity. For example, the particles may have a thermal conductivity that is greater than about 10 W/(m·K), in some embodiments greater than about 20 W/(m·K), in some embodiments greater than about 50 W/(m·K), in some embodiments greater than about 100 W/(m·K), in some embodiments greater than about 200 W/(m·K), and in some embodiments greater than about 200 W/(m·K). For example, in some embodiments, the particles may be or include a conductive ceramic material such as oxides of aluminum (e.g., alumina) and/or nitrides of aluminum. Additional examples include oxide or nitrides of other metals, such as titanium.

In some embodiments, the particles may include conductive materials such as silver, copper, gold, nickel tin, or other conductive metals or ceramics. In such embodiments, the via may be free of the conductive layer adjacent the inner surface of the substrate. However, in other embodiments, the via may include both the conductive layer and conductive particles. Additionally, in some embodiments, the polymeric composition may include both particles of an electrically conductive material (e.g., silver) and particles of a thermally conductive material (e.g., alumina, aluminum nitride).

In some embodiments, the particles may include a layer of conductive material over a base material. For instance, the particles may include a layer of metal (e.g., silver, gold, copper etc.) over a base material (e.g., alumina, a metal, etc.).

The particles of the polymeric composition may have an average particles size (d50) that ranges from about 5 microns to about 150 microns, in some embodiments from about 10 microns to about 100 microns, and in some embodiments from about 20 microns to about 80 microns.

However, in other embodiments, vias of a single conductive material may be employed, such as a conductive metal or other suitable material. Example materials include copper, nickel, tin, silver, gold, or any other suitable conductive material.

The via(s) may exhibit low electrical resistance, which may be achieved by metallization of the sidewalls of the via (e.g., the inner surfaces of the substrate). For example, the via(s) may exhibit a volume resistivity that is less than about 0.01 ohm-cm tested in accordance with ASTM B193-16, in some embodiments less than about 0.001 ohm-cm, and in some embodiments about 0.0001 ohm-cm, or less.

Additionally, the substrate of the filter may include a material having a high thermal conductivity. For example, the thermal conductivity of the substrate may be greater than about 10 W/(m·K) at 300 K, in some embodiments greater than about 15 W/(m·K), in some embodiments greater than about 20 W/(m·K), in some embodiments greater than about 25 W/(m·K), and in some embodiments greater than about 50 W/(m·K).

The substrate(s) and/or dielectric layer(s) may include a material having a dielectric constant that is less than about 30 as determined in accordance with ASTM D2520-13 at an operating temperature of 25° C. and frequency of 500 MHz, in some embodiments less than about 25, in some embodiments less than about 20, and in some embodiments less than about 15. However, in other embodiments, a material having a dielectric constant higher than 30 may be used to achieve higher frequencies and/or smaller components. For example, in such embodiments, the dielectric constant may range from about 30 to about 120, or greater as determined in accordance with ASTM D2520-13 at an operating temperature of 25° C. and frequency of 500 MHz, in some embodiments from about 50 to about 100, and in some embodiments from about 70 to about 90.

For example, the substrate(s) and/or dielectric layers may comprise one or more suitable ceramic materials. Suitable materials are generally electrically insulating and thermally conductive. For example, in some embodiments, the substrate may include sapphire, ruby, alumina ($Al_2O_3$), aluminum nitride (AlN), beryllium oxide (BeO), aluminum oxide ($Al_2O_3$), boron nitride (BN), silicon (Si), silicon carbide (SiC), silica ($SiO_2$), silicon nitride ($Si_3N_4$), gallium arsenide (GaAs), gallium nitride (GaN), zirconium dioxide ($ZrO_2$), mixtures thereof, oxides and/or nitrides of such materials, or any other suitable ceramic material. Additional example ceramic materials include barium titanate ($BaTiO_3$), calcium titanate ($CaTiO_3$), zinc oxide (ZnO), ceramics containing low-fire glass, or other glass-bonded materials.

The thin film inductor may include a conductive layer forming a coil. The coil may have a single loop diameter that is greater than about 200 microns, in some embodiments greater than about 400 microns, in some embodiments greater than about 500 microns, in some embodiments greater than about 600 microns.

The thin film inductor may include a conductive layer having a width in the X-Y plane that is greater than about 40 microns, in some embodiments greater than about 50 microns, in some embodiments greater than about 70 microns, and in some embodiments greater than about 90 microns.

In some embodiments, the thin film inductor may include multiple conductive layers that are spaced apart by a dielectric layer. The dielectric layer may include one or more suitable dielectric materials, including those described above with respect to the substrate. The dielectric layer may be arranged over the top surface of the substrate. The dielectric layer may have a top surface and a bottom surface. The bottom surface of the dielectric layer may face the top surface of the substrate. The thin film inductor may include a first conductive layer formed over the top surface of the substrate, a second conductive layer formed over the top surface of the dielectric layer, and a via connecting the first conductive layer with the second conductive layer.

As used herein, "formed over," may refer to a layer that is directly in contact with another layer. However, intermediate layers may also be formed therebetween. Additionally, when used in reference to a bottom surface, "formed over" may be used relative to an exterior surface of the component. Thus, a layer that is "formed over" a bottom surface may be closer to the exterior of the component than the layer over which it is formed.

The thin film capacitor may include electrodes that are spaced apart by at least the thickness of the dielectric layer. The thin film capacitor may include a first electrode formed over the bottom surface of the substrate and a second electrode formed over a bottom surface of the dielectric layer.

The conductive layers of the thin film components (e.g., thin film capacitor, thin film inductor) and/or a resistive layer of a thin film resistor (if present) may have thicknesses in the Z-direction that range from about 0.05 micrometers to about 50 micrometers, in some embodiments from about 0.1 micrometers to about 20 micrometers, in some embodiments from about 0.3 micrometer to about 10 micrometers, and in some embodiments from about 1 micrometer to about 5 micrometers.

The filter may be configured as a variety of suitable filter types, including, for example, a low pass filter, a high pass filter, or a bandpass filter. The filter may have a characteristic frequency (e.g., a low pass frequency, high pass frequency, an upper bound of a band pass frequency, or a lower bound of a band pass frequency) that ranges from about 100 MHz to about 5 GHz, or higher, in some embodiments from about 150 MHz to about 4 GHz, in some embodiments from about 200 MHz to about 3 GHz.

The filter may exhibit excellent filtering characteristics. For example, the insertion loss ($S_{2,1}$) may be less than about −20 dB for frequencies of about 565 MHz to about 3 GHz. The insertion loss ($S_{2,1}$) may be less than about −30 dB for frequency of about 565 MHz to about 2.4 GHz. The insertion loss ($S_{2,1}$) may be less than about −35 dB for frequency of about 565 MHz to about 2.4 GHz.

The insertion loss may be greater than about −1 dB for frequencies ranging from 0 MHz to about 400 MHz, in some embodiments greater than about −0.75 dB, in some embodiments greater than about −0.6 dB.

As indicated above, the filter may be configured for surface mounting. For example, the filter may include one or more contact pads may be exposed along a bottom surface of the filter for surface mounting the component to a mounting surface, such as a printed circuit board (PCB). For example, the filter may be configured for grid array-type surface mounting, such as land grid array (LGA) type mounting, ball grid array (BGA) type mounting, or any other suitable type of grid array-type surface mounting. As such, the contact pads may not extend alongside surfaces of the substrate, for example as with a surface mount device (SMD). As such, in some embodiments side surfaces of the substrate may be free of conductive material.

However, in other embodiments, the device may configured as an SMD device. One or more external terminations may be formed on side surfaces of the substrate for surface mounting the filter. For example, the filter may be configured as a monolithic device having plated external terminations on the side surfaces. As another example, plated castellations may be formed on one or more side surface of the substrate for surface mounting the device.

As indicated above, the filter may generally be compact. For example, the filter may have a length that is less than about 14 mm, in some embodiments less than about 12 mm, in some embodiments less than about 10 mm, and in some embodiments less than about 8 mm, and in some embodiments less than about 4 mm. The filter may have a width that is less than about 8 mm, in some embodiments less than about 6 mm, and in some embodiments less than about 4 mm. For example, the filter may have an EIA case size of 5550, 3640, 2816, 2520, 2220, 1206, 1005, 0805, or smaller. In an exemplary embodiment the filter has an EIA case size of 2816.

In some embodiments, the filter may include a first protective layer exposed along a top surface or a bottom surface of the filter. For example the first protective layer may be formed over the top surface of the substrate and/or over one or more thin film components that are formed over the top surface of the substrate. For example, a cover substrate may be formed over the top surface of the substrate.

The cover substrate may include a suitable ceramic dielectric material, as described below. The cover substrate may have a thickness that ranges from about 100 microns to about 600 microns, in some embodiments from about 125 microns to about 500 microns, in some embodiments from about 150 microns to about 400 microns, and in some embodiments from about 175 microns to about 300 microns.

In other embodiments, the first protective layer may include a layer of a polymeric material, such as polyimide, SiNO, $Al_2O_3$, $SiO_2$, $Si_3N_4$, benzocyclobutene, or glass. In such embodiments, the first protective layer may have a thickness that ranges from about 1 micron to about 300 microns, in some embodiments from about 5 microns to about 200 microns, and in some embodiments from about 10 microns to about 100 microns.

In some embodiments, a second protective layer may be exposed along a bottom surface of the filter (e.g., formed over the bottom surface of the dielectric layer). The second protective layer may include a polymeric material and/or a dielectric material (e.g., organic or inorganic). Examples include polyimide, SiNO, $Al_2O_3$, $SiO_2$, $Si_3N_4$, benzocyclobutene, or glass. The contact pad(s) may protrude through the second protective layer such that the contact pad(s) are exposed along the bottom surface of the filter for surface mounting the filter.

In some embodiments, the filter may include at least one adhesion layer in contact with the thin film components (e.g., inductor(s), capacitor(s), resistor(s), etc.). The adhesion layer may be or include a variety of materials that are suitable for improving adhesion between the thin film components and adjacent layers, such as the substrate, and/or the protective layer(s) (e.g., the dielectric layer(s), a polymeric layer). As examples, the adhesion layer may include at least one of Ta, Cr, TaN, TiW, Ti, or TiN. For instance, the adhesive layer may be or include tantalum (Ta) (e.g., tantalum or an oxide or nitride thereof) and may be formed between the thin film components and the substrate to improve adhesion therebetween. Without being bound by theory, the material of the adhesion layer may be selected to overcome phenomena such as lattice mismatch and residual stresses.

The adhesion layer(s) may have a variety of suitable thicknesses. For example, in some embodiments, the thicknesses of the adhesion layer(s) may range from about 100 angstroms to about 1000 angstroms, in some embodiments from about 200 angstroms to about 800 angstroms, in some embodiments from about 400 angstroms to about 600 angstroms.

I. Example Embodiments

FIG. 1A illustrates a schematic of a filter 10 according to aspects of the present disclosure. The filer 10 may include a capacitor 12 connected between ground 14 and an output 16. An inductor 18 may be connected between an input 20 and the output 16.

Figure 1B:
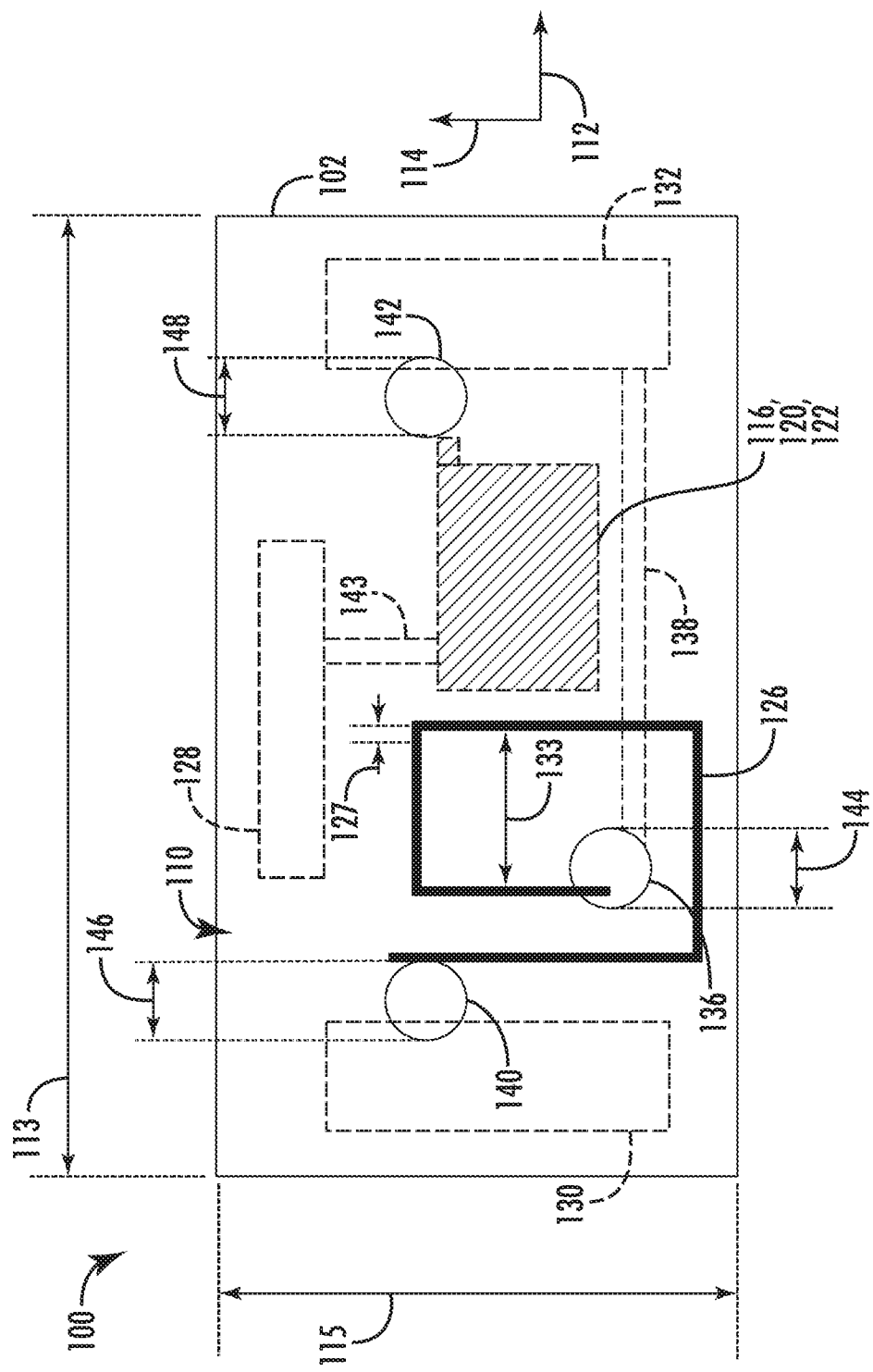
FIG. 1B illustrates a top down view of one embodiment of a high power thin film filter in accordance with aspects of the present disclosure.
Figure 1C:
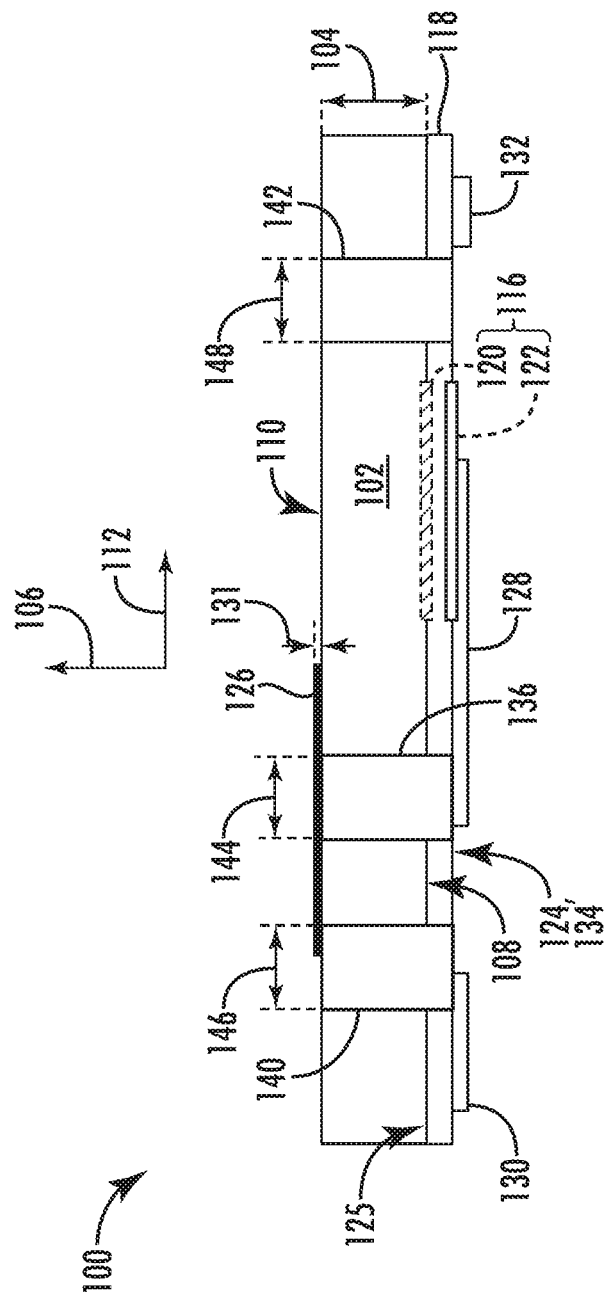
FIG. 1C illustrates a side elevation view of the filter of FIG. 1A.

FIG. 1B illustrates a top down view of one embodiment of a high power thin film filter 100 in accordance with aspects of the present disclosure. FIG. 1C illustrates a side elevation view of the filter 100 of FIG. 1A. The filter 100 may include a substrate 102 having a substrate thickness 104 in a Z-direction 106 between a bottom surface 108 and a top surface 110 of the substrate 102. The Z-direction 106 may be perpendicular to each of an X-direction 112 and a Y-direction 114 (FIG. 1B). The substrate 102 may include a ceramic material.

The filter 100 may have a length 113 in the X-direction 112 and a width 115 in the Y-direction 114. The length 113 may be greater than the width 155. The length 113 may be less than about 14 mm.

A thin film capacitor 116 may be formed over the bottom surface 108. For example, the filer 100 may include a dielectric layer 118. The thin film capacitor 116 may include a first electrode 120 formed over the bottom surface 108 of the substrate 102 and a second electrode 122 formed over a bottom surface 124 of the dielectric layer 118. The dielectric layer 118 may have a top surface 125 opposite the bottom surface 124. The top surface 125 of the dielectric layer 118 may face the bottom surface 108 of the substrate 102.

A thin film inductor 126 may be spaced apart from the thin film capacitor 116 in the Z-direction 106 by at least the thickness 104 of the substrate 102. For example, the thin film inductor 126 may include a conductive layer formed over the top surface 110 of the substrate 102. The thickness 104 of the substrate 102 may be greater than about 300 microns. The conductive layer of the thin film inductor 126 may have a width 127 in the X-Y plane. The width 127 may be greater than about 40 microns. The thin film inductor 126 may have a thickness 131 (FIG. 1C) in the Z-direction 106 that is greater than about 10 microns. The thin film inductor 126 may include have a coiled shape that a single loop diameter 133 that is greater than about 400 microns.

A ground contact pad 128, an input contact pad 130, and an output contact pad 132 may be exposed along a bottom surface 134 of the filter 100 for mounting the filter 100 to a mounting surface.

One or more vias may be formed in the substrate 102. A first via 136 may electrically connect a first end of the thin film inductor 126 with the output contact pad 132. For example, the first via 136 may be connected with the thin film inductor 126 at the top surface 110 of the substrate 102 and connected with a conductive layer 138 (FIG. 1B) that is formed over the bottom surface 124 of the dielectric layer 118. The conductive layer 138 may be connected between the first via 136 and the output contact pad 132.

A second via 140 may be connected between a second end of the thin film inductor 126 and the input contact pad 130. The second via 140 may be connected with the thin film inductor 126 at the top surface 110 of the substrate 102 and connected with the input contact pad 130 at the bottom surface 124 of the dielectric layer 118. A third via 142 may electrically connect the first electrode 120 of the thin film capacitor 116 with the output contact pad 132. The second electrode 122 may be connected with the ground electrode 128, for example by a conductive layer 143 formed over the bottom surface 124 of the dielectric layer 118.

One or more of the vias may be relatively large. For example, the vias 136, 140, 142 may have respective widths 144, 146, 148 in the X-Y plane. A ratio of the substrate thickness 104 to one or more of the widths 144, 146, 148 may be less than about 7. For example, the substrate thickness 104 may be greater than about 300 microns. The widths 144, 146, 148 may be greater than about 100 microns. The vias 136, 140, 142 may include an epoxy and/or alumina particles.

The filter 100 may correspond with the filter 10 of FIG. 1A. For example, the thin film capacitor 116 may be connected between the input contact pad 130 and output contact pad 132 and may correspond with the capacitor 12 of the filter 10 of FIG. 1A. The thin film inductor 126 may be electrically connected between the input contact pad 130 and the output contact pad 132 and may correspond with the inductor 18 of FIG. 1A.

Figure 1D:
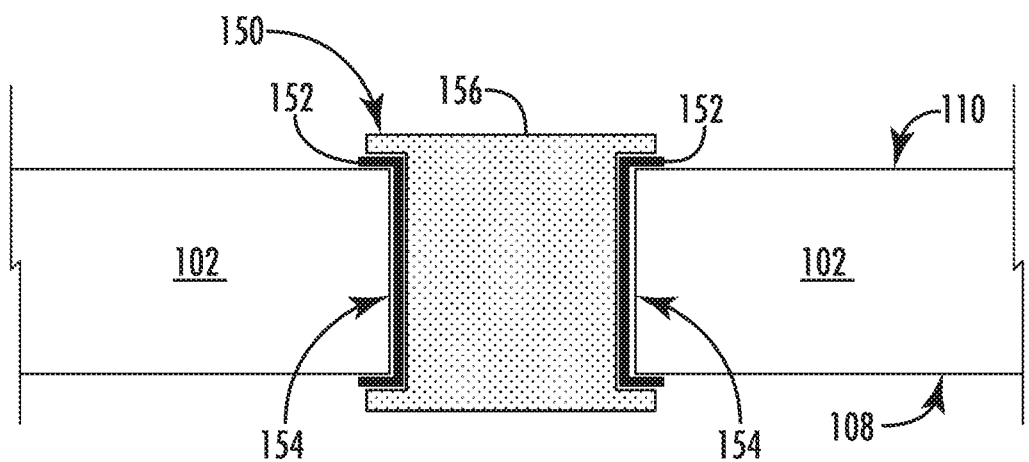
FIG. 1D illustrates a side elevation view of an example via of the filter of FIGS. 1B and 1C according to aspects of the present disclosure.

FIG. 1D illustrates a side elevation view of an example via 150 according to aspects of the present disclosure. The via 150 may correspond to one or more of the vias 136, 140, 142 described above with reference to FIGS. 1B and 1C. The via 150 may include a conductive layer 152 formed over an inner surface 154 of the substrate 102 (e.g., to form a sidewall of the via 150). For example, the inner surface 154 of the substrate 202 may be formed by drilling (mechanical drilling or laser drilling) through the substrate. The conductive layer 152 may be formed using a variety of suitable techniques, such as sputtering, plating, etc. The conductive layer 152 may extend through the substrate 102 from the first surface 108 to the second surface 110 of the substrate 102. The conductive layer 152 may electrically connect a component (e.g., a capacitor, inductor etc.) on the first surface 108 with a component on the second surface 110, for example as described above with reference to FIGS. 1B and 1C. The via 150 may be filled with polymeric composition 156, which may include thermally conductive and/or electrically conductive particles, for example as described above.

Figure 2A:
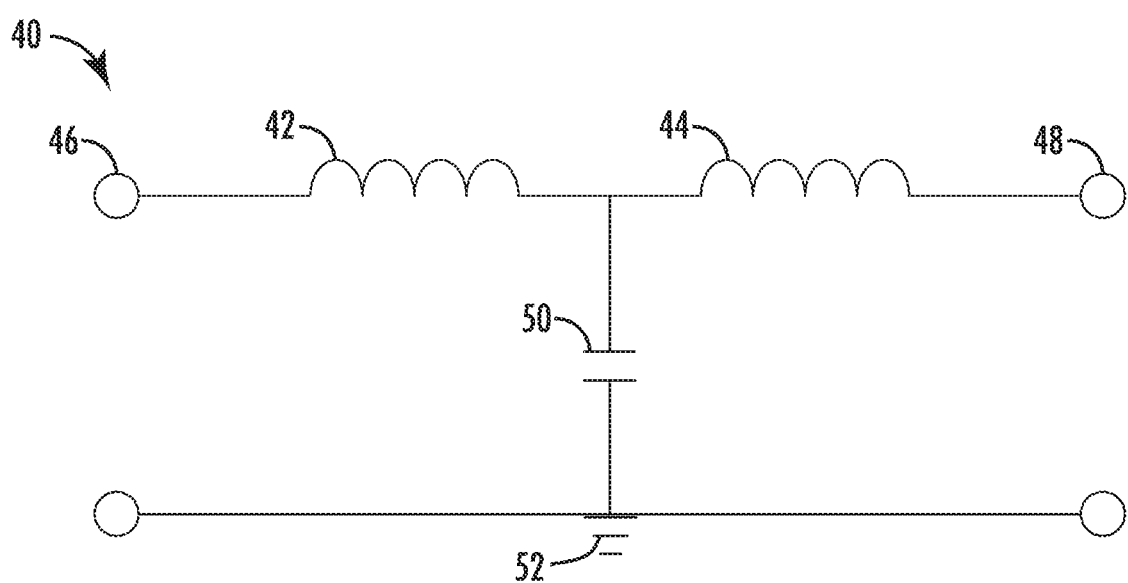
FIG. 2A illustrates a schematic view of a high power thin film filter in accordance with aspects of the present disclosure.

FIG. 2A illustrates a schematic view of a high power thin film filter 40 in accordance with aspects of the present disclosure. The filter 40 may include a first inductor 42 and a second inductor 44. The first inductor 42 and second inductor 44 may be connected in series between an input 46 and an output 48. A capacitor 50 may be connected at one end a point between the first inductor 42 and the second inductor 44 and at another end with ground 52.

Figure 2B:
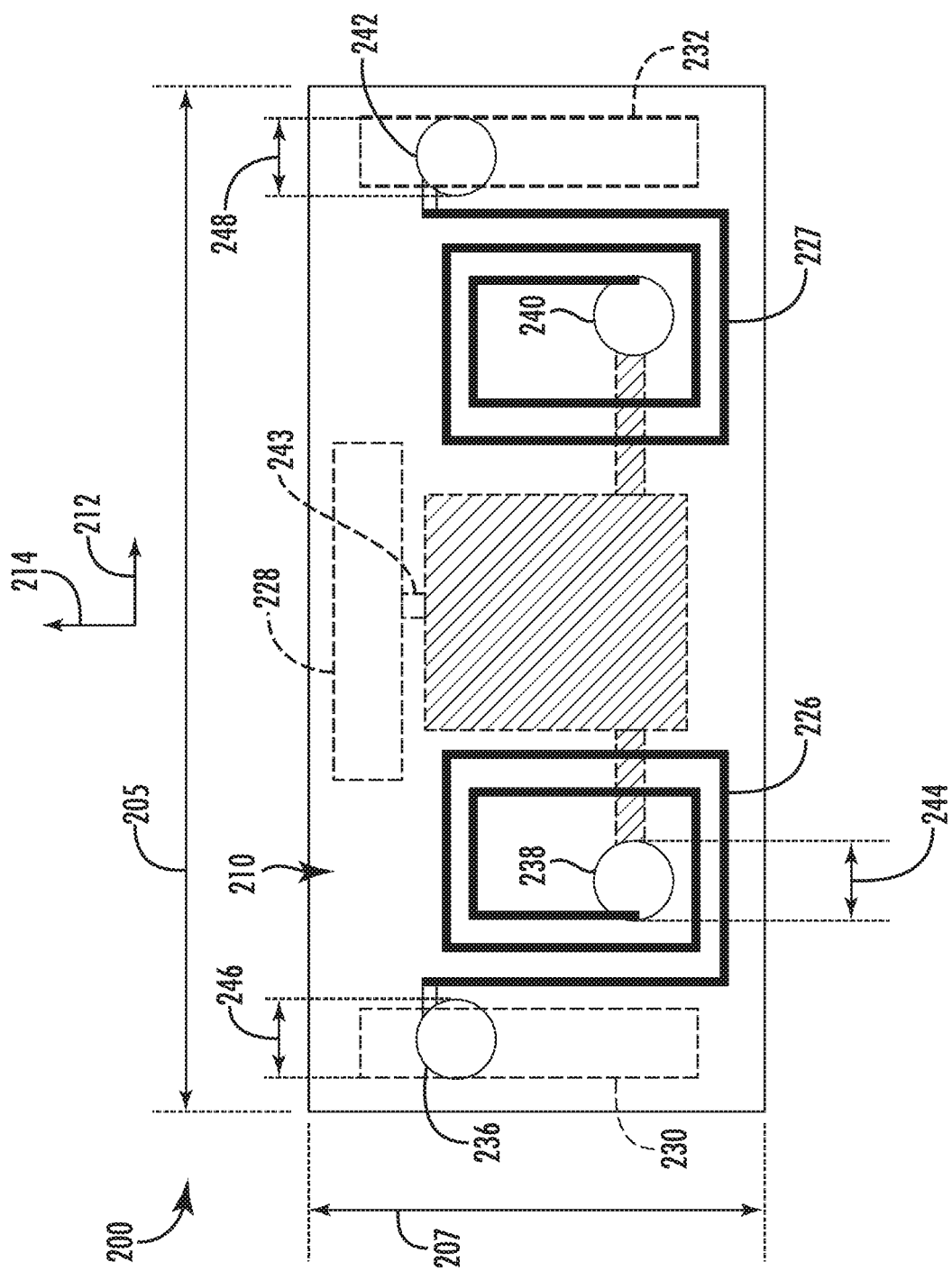
FIG. 2B illustrates a top down view of another embodiment of a high power thin film filter in accordance with aspects of the present disclosure.
Figure 2C:
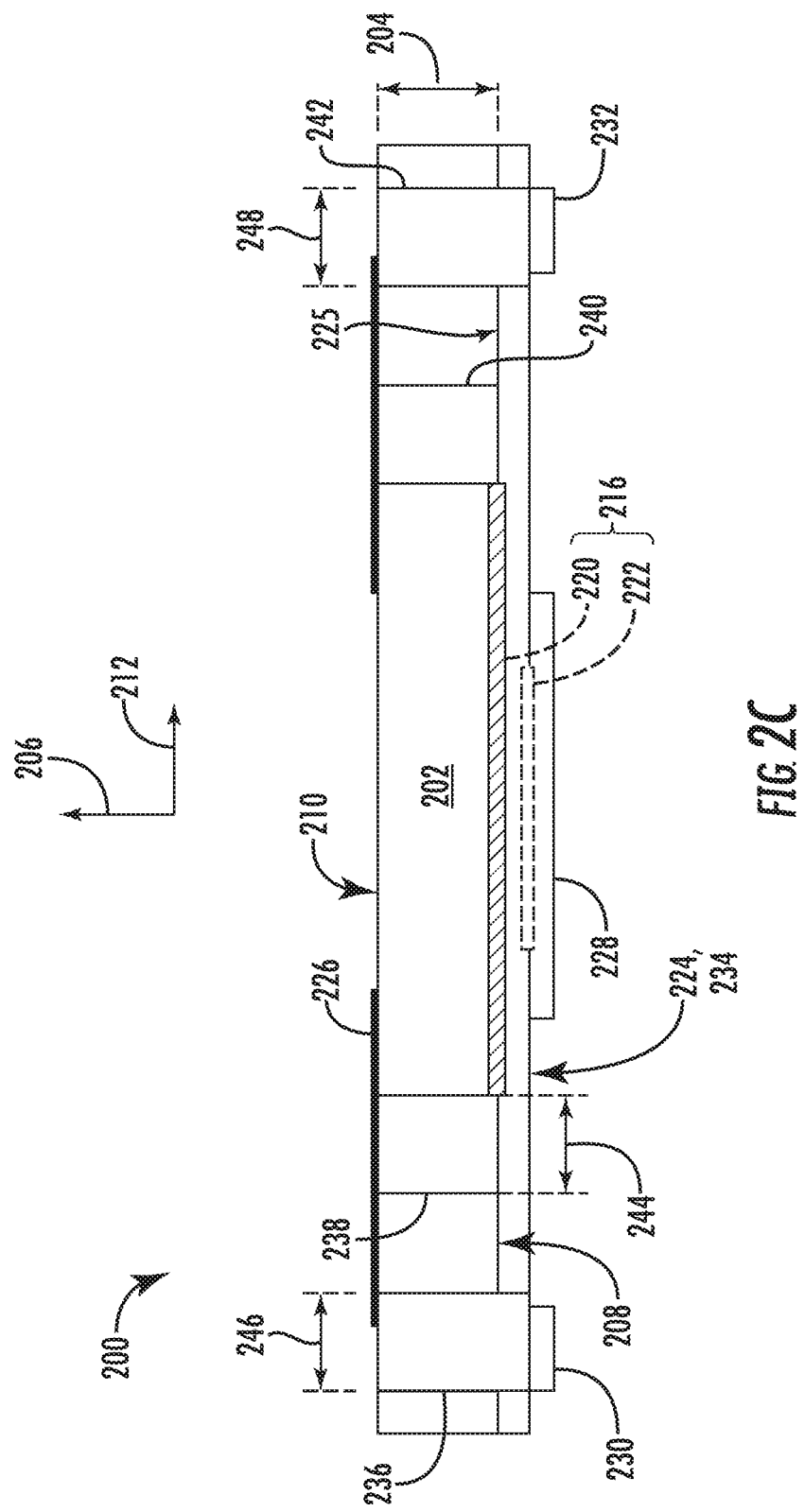
FIG. 2C illustrates a side elevation view of the filter of FIG. 2B.

FIG. 2B illustrates a top down view of another embodiment of a high power thin film filter 200 in accordance with aspects of the present disclosure. FIG. 2C illustrates a side elevation view of the filter 200 of FIG. 2B. The filter 200 may include a substrate 202 having a substrate thickness 204 in a Z-direction 206 between a bottom surface 208 and a top surface 210. The Z-direction 206 may be perpendicular to each of an X-direction 212 and a Y-direction 214 (FIG. 2B).

The filter 200 may have a length 205 in the X-direction 212 and a width 207 in the Y-direction 214. The length 205 may be greater than the width 207. The length 205 may be less than about 14 mm.

A thin film capacitor 216 may be formed over the bottom surface 208. For example, the filer 200 may include a dielectric layer 218. The thin film capacitor 216 may include a first electrode 220 formed over the bottom surface 208 of the substrate 202 and a second electrode 222 formed over a bottom surface 224 of the dielectric layer 218. The dielectric layer 218 may have a top surface 225 opposite the bottom surface 224. The top surface 225 of the dielectric layer 218 may face the bottom surface 208 of the substrate 202.

A first thin film inductor 226 and a second thin film inductor 227 may be spaced apart from the thin film capacitor 216 in the Z-direction 206 by at least the thickness 204 of the substrate 202. For example, the first thin film inductor 226 and the second thin film inductor 227 may be formed over the top surface 210 of the substrate 202. For example, the first thin film inductor 226 and the second thin film inductor 227 may be formed directly on the top surface 210 or on one or more intermediary layers that are between the top surface 210 and the first thin film inductor 226 and the second thin film inductor 227. The thickness 204 of the substrate 202 may be greater than about 300 microns.

A ground contact pad 228, an input contact pad 230, and an output contact pad 232 may be exposed along a bottom surface 234 of the filter 200 for mounting the filter 200 to a mounting surface.

One or more vias may be formed in the substrate 202. In some embodiments, the vias may include a conductive layer formed over an inner surface of the substrate 202 and may be filled with a polymeric composition, for example as described above with reference to the via 150 of FIG. 1C. A first via 236 may electrically connect a first end of the thin film inductor 226 with the input contact pad 230. A second via 238 may electrically connect the thin film inductor 226 with the first electrode 220 of the thin film capacitor 216. A third via 240 may electrically connect the second inductor 227 with the first electrode 220 of the thin film capacitor 216. A fourth via 242 may be connected between the second inductor 227 and the output contact pad 232.

Figure 3A:
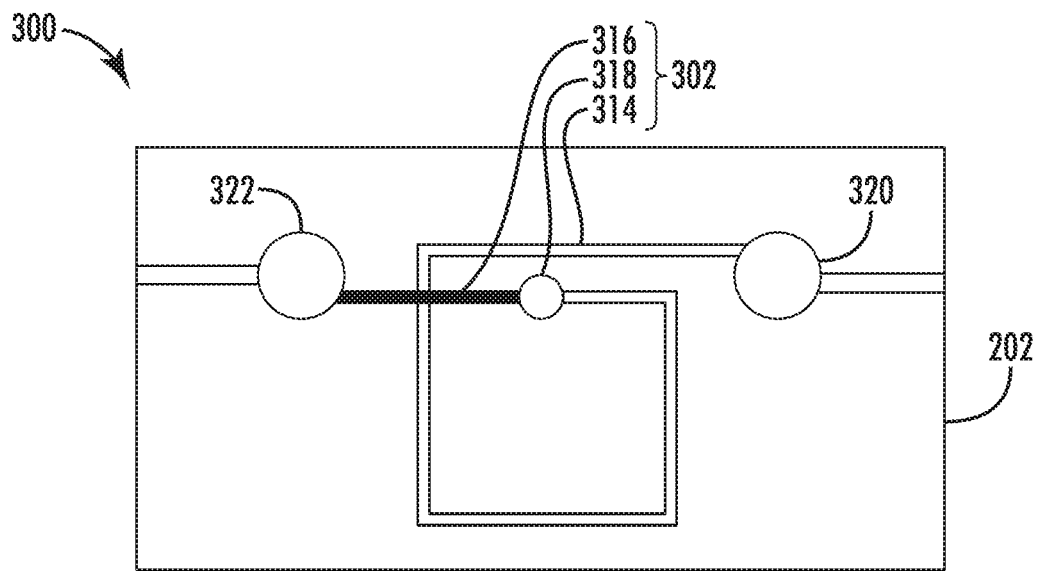
FIG. 3A illustrates a portion of a filter including an inductor according to aspects of the present disclosure.
Figure 3B:
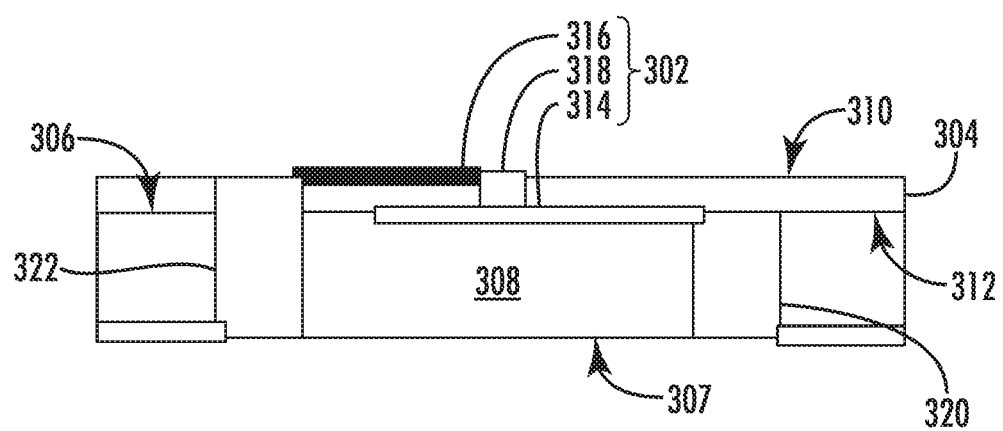
FIG. 3B is a side elevation view of the filter of FIG. 3A.

FIG. 3A illustrates a top down view of a portion of a filter 300 including an inductor 302 according to aspects of the present disclosure. FIG. 3B is a side elevation view of the filter of FIG. 3A. In some embodiments, the filter 100 described above with reference to FIGS. 1A through 1C may include the inductor 302 in place of the inductor 126 or in addition to the inductor 126. In some embodiments, the filter 200 described above with reference to FIGS. 2A through 2C may include the inductor 302 in place of one or both of the inductors 226, 227 or may additionally include the inductor 302.

The filter 300 may include a dielectric layer 304. For example, the dielectric layer 304 may be arranged over a top surface 306 of a substrate 308, which is opposite a bottom surface 307 of the substrate 308. The dielectric layer 304 may have a top surface 310 and a bottom surface 312 opposite the top surface 310. The bottom surface 312 of the dielectric layer 304 may face the top surface 306 of the substrate 308. The thin film inductor 302 may include a first conductive layer 314 formed over the top surface 306 of the substrate 304, a second conductive layer 316 formed over the top surface 310 of the dielectric layer 304, and a via 318 connecting the first conductive layer 314 with the second conductive layer 316.

The first conductive layer 314 may be connected with a first via 320 or another component of a thin film filter. The second conductive layer 316 may be connected with a second via 322 or another component of the thin film filter.

Various surfaces are referred to as "top" and "bottom" for convenience only. It should be understood that the component may be configured such that one or more thin film capacitors are arranged on "top" of the component (e.g., relative to the mounting surface) instead of on the "bottom" of the component. Similarly, It should be understood that the component may be configured such that one or more thin film inductors are arranged on "bottom" of the component (e.g., proximate the mounting surface) instead of on "top" of the component.

Figure 4:
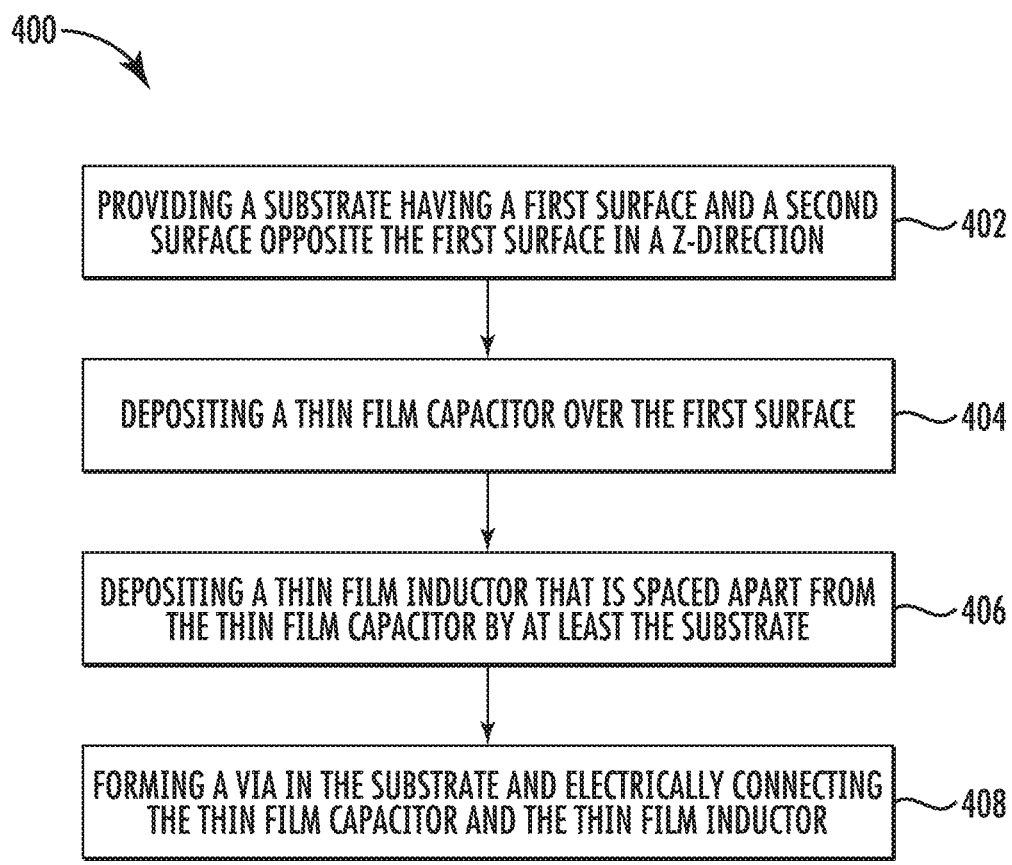
FIG. 4 is a flowchart of a method for forming a high power thin film filter according to aspects of the present disclosure.

Referring to FIG. 4, aspects of the present disclosure are directed to a method 400 for forming a high power thin film filter. In general, the method 400 will be described herein with reference to the thin film filters 100, 200 described above with reference to FIGS. 1A through 3B. However, it should be appreciated that the disclosed method 400 may be implemented with any suitable thin film filter. In addition, although FIG. 4 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 400 may include, at (402), providing a substrate having a substrate thickness in a Z-direction between a top surface and a bottom surface, the Z-direction perpendicular to an X-Y plane, for example as described above with reference to the filters 100, 200 of FIGS. 1A through 3B.

The method 400 may include, at (404), depositing a thin film capacitor over the bottom surface, for example as described above with reference to the filters 100, 200 of FIGS. 1A through 2C.

The method 400 may include, at (406), depositing a thin film inductor that is spaced apart from the thin film capacitor by at least the thickness of the substrate, for example as described above with reference to the filters 100, 200 of FIGS. 1A through 2C.

The method 400 may include, at (408), forming one or more vias in the substrate and electrically connecting the thin film capacitor and the thin film inductor, for example as described above with reference to the filters 100, 200 of FIGS. 1A through 2C. The via(s) may include a polymeric composition, for example as described above.

II. Simulation Data

Figure 5:
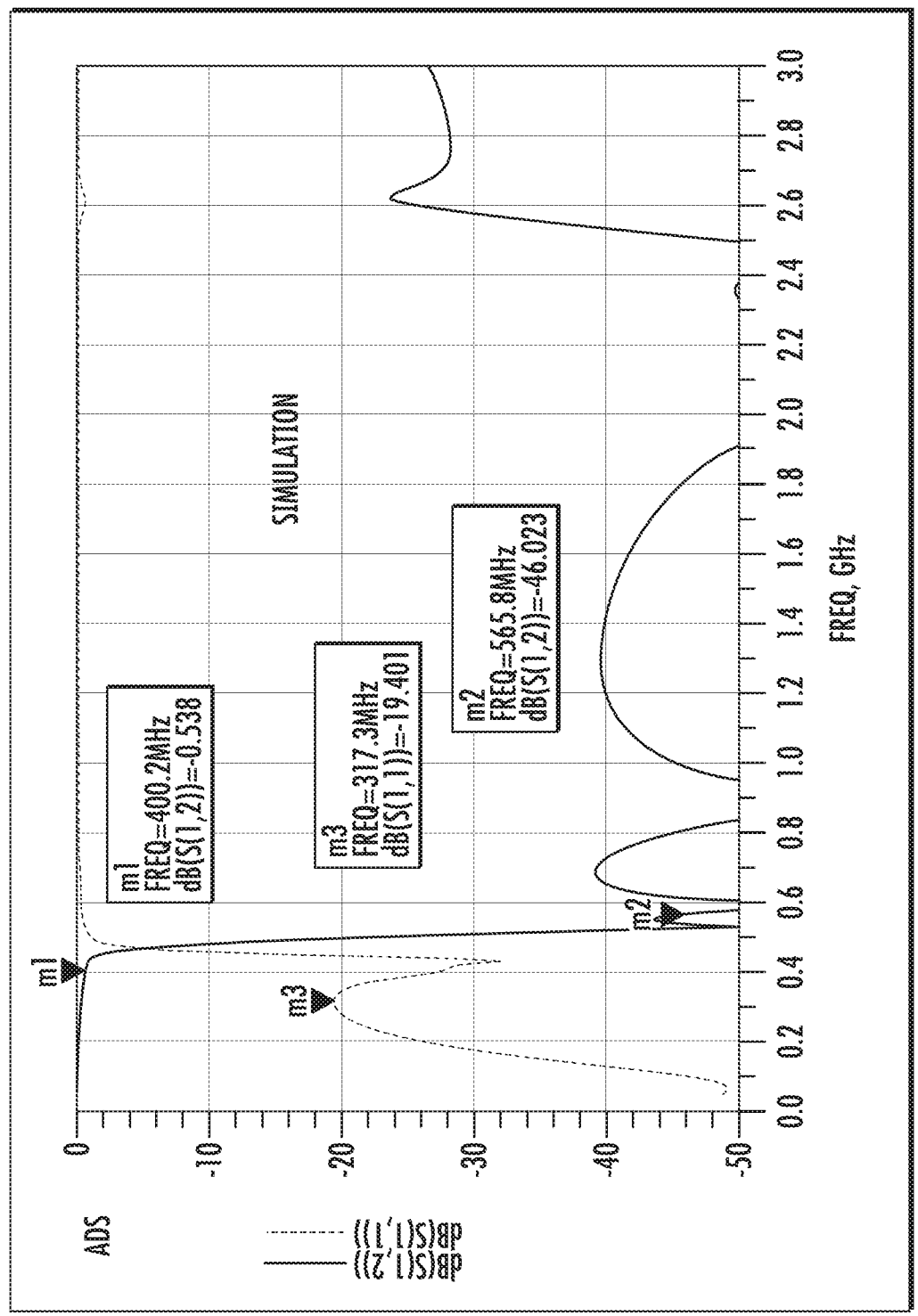
FIG. 5 illustrates simulated insertion loss ($S_{2,1}$) and return loss ($S_{1,1}$) data for a filter according to aspects of the present disclosure.

FIG. 5 illustrates simulated insertion loss ($S_{2,1}$) and return loss ($S_{1,1}$) data for a filter according to aspects of the present disclosure. The simulation data shows low insertion loss ($S_{2,1}$) above a low pass frequency of about 400 MHz. In some embodiments, the low pass frequency may range from about 100 MHz to about 5 GHz. More specifically, the insertion loss ($S_{2,1}$) may be less than about −20 dB for frequencies of about 565 MHz to about 3 GHz. The insertion loss ($S_{2,1}$) may be less than about −30 dB for frequency of about 565 MHz to about 2.4 GHz. The insertion loss ($S_{2,1}$) may be less than about −35 dB for frequency of about 565 MHz to about 2.4 GHz.

The insertion loss may be close to zero for frequencies that are less than the low pass frequency of about 400 MHz. For example, the insertion loss may be greater than about −1 dB for frequencies ranging from 0 MHz to about 400 MHz.

III. Testing

A. Response Characteristics

Testing for insertion loss, return loss, and other response characteristics may be performed using a source signal generator (e.g., a 1306 Keithley 2400 series Source Measure Unit (SMU), for example, a Keithley 2410-C SMU). For example, an input signal may be applied to the input port of the filter, and an output signal may be measured at the output port of the filter using the source signal generator.

Figure 6:
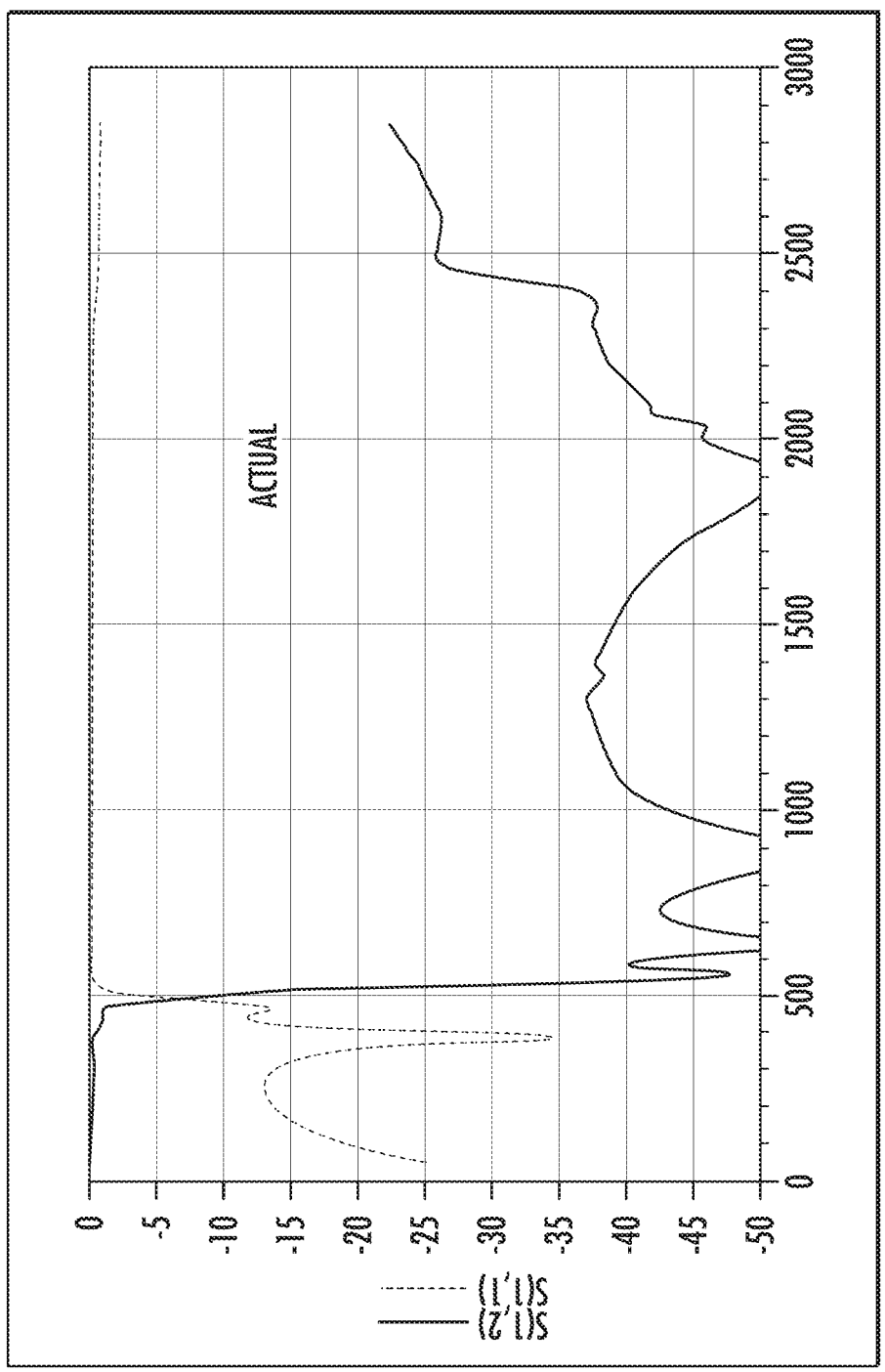
FIG. 6 illustrates experimentally obtained insertion loss and return loss data for the filter.

A filter was fabricated according to aspects of the present disclosure. FIG. 6 illustrates experimentally obtained insertion loss and return loss data for the filter. As illustrated in FIG. 5, the tested data shows low insertion loss ($S_{2,1}$) above a low pass frequency of about 400 MHz. More specifically, the insertion loss ($S_{2,1}$) may be less than about −20 dB for frequencies of about 510 MHz to about 3 GHz. The insertion loss ($S_{2,1}$) may be less than about −30 dB for frequency of about 510 MHz to about 2.4 GHz. The insertion loss ($S_{2,1}$) may be less than about −35 dB for frequency of about 510 MHz to about 2.4 GHz.

The insertion loss may be close to zero for frequencies that are less than the low pass frequency of about 400 MHz. For example, the insertion loss may be greater than about −1 dB for frequencies ranging from 0 MHz to about 400 MHz.

B. Power Capacity

Figure 7:
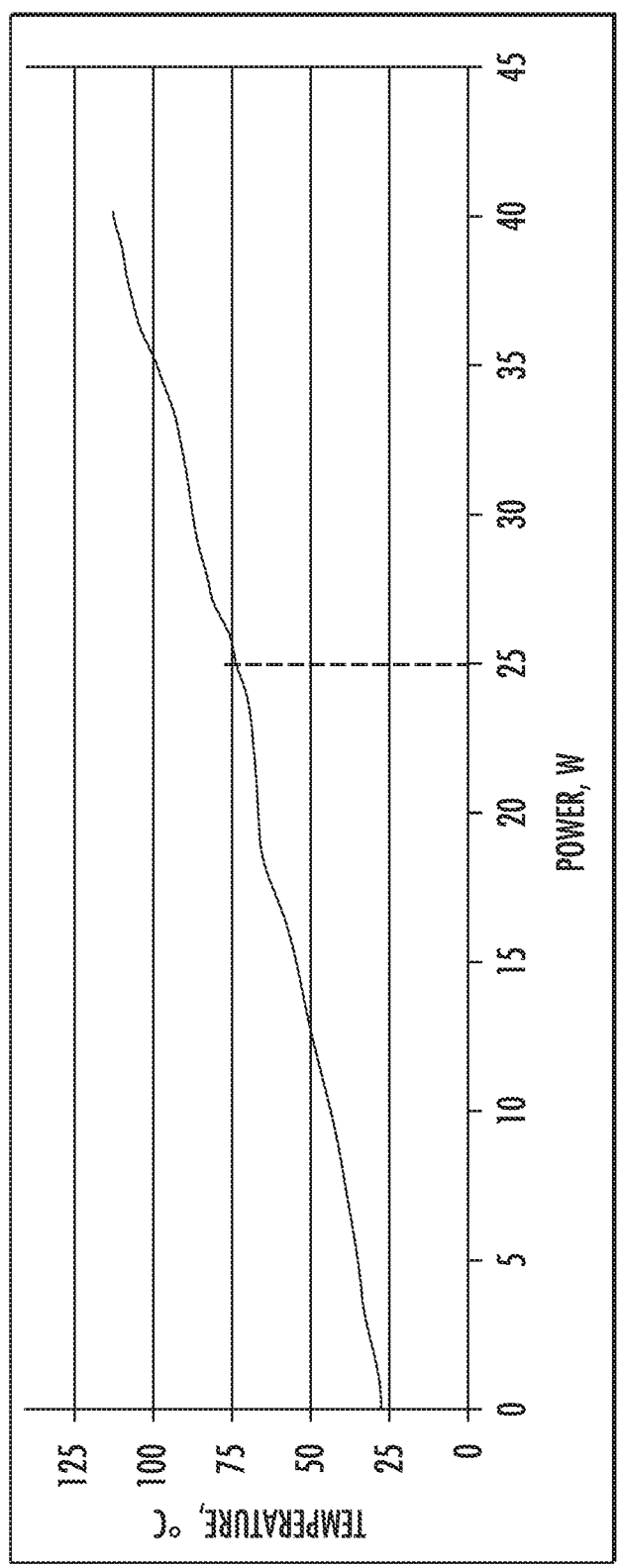
FIG. 7 illustrates power capacity data for a filter according to aspects of the present disclosure.

FIG. 7 illustrates power capacity data for a filter according to aspects of the present disclosure. The filter had an EIA case size of 2816. The filter was subjected to a test signal having a sinusoidal frequency of 500 MHz having a DC bias voltage of 0 V using source signal generator (e.g., a 1306 Keithley 2400 series Source Measure Unit (SMU), for example, a Keithley 2410-C SMU). The power level of the test signal was incrementally increased in an environment that was about 23° C. until the filter assembly reached a steady state temperature at each steady state power level. The process was repeated until a steady state power level of 40 W was reached. Each steady state temperature was measured using an infrared thermometer.

The power capacity of the filter is defined as the power level at which the filter has a steady state temperature of about 75° C. The following table shows the power capacity, area power capacity, and volume power capacity of the tested filter:

| Length (mm) | Width (mm) | Thickness (mm) | Power Capacity (W) | Area Power Capacity (W/mm$^2$) | Volume Power Capacity (W/mm$^3$) |
|---|---|---|---|---|---|
| 7 | 4 | 1.2 | 25 | 0.9 | 0.7 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A high power thin film filter comprising:
 a substrate having a first surface and a second surface opposite the first surface in a Z-direction;
 a thin film capacitor formed over the first surface;
 a thin film inductor spaced apart from the thin film capacitor by at least the substrate in the Z-direction; and
 a via formed in the substrate and electrically connecting the thin film capacitor and the thin film inductor, the via comprising a polymeric composition.

2. The filter of claim 1, wherein the via comprises a conductive layer formed over an inner surface of the substrate, the conductive layer extending through the substrate from the first surface to the second surface of the substrate.

3. The filter of claim 1, wherein the via has a via width in an X-Y plane that is perpendicular to the Z-direction, and the substrate has a substrate thickness in the Z-direction, and a ratio of the substrate thickness to the via width is less than about 7.

4. The filter of claim 1, wherein a substrate thickness of the substrate in the Z-direction is greater than about 300 microns.

5. The filter of claim 1, wherein the via width is greater than about 100 microns.

6. The filter of claim 1, wherein the polymeric composition comprises an epoxy.

7. The filter of claim 1, wherein the polymeric composition comprises alumina particles.

8. The filter of claim 1, wherein the polymeric composition comprises conductive particles.

9. The filter of claim 1, wherein the substrate comprises sapphire.

10. The filter of claim 1, wherein the thin film inductor comprises a conductive layer having a width in an X-Y plane that is perpendicular to the Z-direction, the width of the conductive layer being greater than about 40 microns.

11. The filter of claim 1, wherein the thin film inductor comprises a conductive layer having a thickness in the Z-direction that is greater than about 10 microns.

12. The filter of claim 1, wherein the thin film inductor comprises a conductive layer forming a coil having a single loop diameter that is greater than about 200 microns.

13. The filter of claim 1, further comprising a plurality of contact pads exposed along a bottom surface of the filter for mounting the filter to a mounting surface.

14. The filter of claim 1, wherein the filter has a power capacity that is greater than about 15 W.

15. The filter of claim 1, wherein the filter has an area power capacity that is greater than about 0.6 W/mm$^2$.

16. The filter of claim 1, wherein the filter has a length and a width, and wherein the length is greater than the width, and wherein the length is less than about 14 mm.

17. The filter of claim 1, further comprising a dielectric layer arranged over the first surface of the substrate, the dielectric layer having a first surface and a second surface, the second surface of the dielectric layer facing the first surface of the substrate, and wherein the thin film capacitor comprises a first electrode formed over the first surface of the substrate and a second electrode formed over the first surface of the dielectric layer.

18. The filter of claim 17, further comprising a dielectric layer arranged over the second surface of the substrate, the dielectric layer having a first surface and a second surface, the second surface of the dielectric layer facing the second surface of the substrate, and wherein the thin film inductor comprises a first conductive layer formed over the first surface of the substrate, a second conductive layer formed over the second surface of the dielectric layer, and a via connecting the first conductive layer with the second conductive layer.

19. The filter of claim 1, wherein the thin film inductor is formed over the second surface of the substrate.

20. A high power thin film filter comprising:
a substrate having a first surface and a second surface opposite the first surface in a Z-direction; and
a thin film capacitor formed over the first surface; and
a thin film inductor spaced apart from the thin film capacitor by at least the substrate;
wherein the high power thin film filter has an area power capacity that is greater than about 0.5 W/mm$^2$.

21. The filter of claim 20, wherein the filter has a power capacity that is greater than about 15 W.

22. The filter of claim 20, wherein the filter has an area power capacity that is greater than about 0.5 W/mm$^2$.

23. A method for forming a high power thin film filter, the method comprising:
providing a substrate having a first surface and a second surface opposite the first surface in a Z-direction;
depositing a thin film capacitor over the first surface;
depositing a thin film inductor that is spaced apart from the thin film capacitor by at least the substrate; and
forming a via in the substrate electrically connecting the thin film capacitor and the thin film inductor, the via comprising a polymeric composition.

* * * * *